(12) United States Patent
Bresser et al.

(10) Patent No.: US 11,567,106 B2
(45) Date of Patent: Jan. 31, 2023

(54) MEASUREMENT APPARATUS AND MEASUREMENT METHOD

(71) Applicant: Rohde & Schwarz GmbH & Co. KG, Munich (DE)

(72) Inventors: Gerd Bresser, Munich (DE); Friedrich Reich, Stadtbergen/Ortsteil (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 679 days.

(21) Appl. No.: 16/051,599

(22) Filed: Aug. 1, 2018

(65) Prior Publication Data

US 2020/0041545 A1    Feb. 6, 2020

(51) Int. Cl.
| | | |
|---|---|---|
| *G01R 13/02* | (2006.01) | |
| *G01R 19/25* | (2006.01) | |
| *G01R 13/34* | (2006.01) | |
| *G06F 3/14* | (2006.01) | |
| *G06F 1/02* | (2006.01) | |
| *G01R 23/16* | (2006.01) | |

(52) U.S. Cl.
CPC ....... *G01R 13/0272* (2013.01); *G01R 13/345* (2013.01); *G01R 19/2509* (2013.01); *G01R 23/16* (2013.01); *G06F 1/022* (2013.01); *G06F 3/14* (2013.01)

(58) Field of Classification Search
CPC .......... G01R 13/0272; G01R 19/2509
See application file for complete search history.

(56) References Cited

U.S. PATENT DOCUMENTS

| | | | |
|---|---|---|---|
| 7,834,780 B2 | 11/2010 | Sullivan et al. | |
| 9,529,017 B2 | 12/2016 | Martin et al. | |
| 2002/0147554 A1* | 10/2002 | Pickerd | G01R 13/345 702/66 |
| 2003/0218553 A1* | 11/2003 | Azinger | H03M 7/30 341/61 |
| 2004/0010374 A1* | 1/2004 | Raghuraman | E21B 43/00 702/13 |
| 2004/0024548 A1* | 2/2004 | Genther | G06K 9/00503 702/75 |
| 2007/0217694 A1 | 9/2007 | Sullivan et al. | |
| 2012/0310601 A1* | 12/2012 | Martin | H03H 17/0621 702/190 |
| 2014/0160144 A1* | 6/2014 | Martin | G01R 13/0227 345/589 |

FOREIGN PATENT DOCUMENTS

EP    1837665 A2    9/2007

* cited by examiner

*Primary Examiner* — Lisa E Peters
(74) *Attorney, Agent, or Firm* — Westman, Champlin & Koehler, P.A.

(57) ABSTRACT

Measurement apparatus and method for digital data acquisition. A first operation mode is provided for real-time processing of digital data having a reduced sample rate or resolution. Furthermore, a second operation mode is provided for processing the measurement signal off-line with a higher accuracy. In particular, the high accuracy data may be temporarily stored and analyzed upon the operation mode is changed from the real-time mode to the off-line mode.

18 Claims, 4 Drawing Sheets

MEASUREMENT APPARATUS AND MEASUREMENT METHOD

TECHNICAL FIELD

The present invention relates to a measurement apparatus. The present invention further relates to a measurement method. In particular, the present invention relates to measuring of a signal for digital data acquisition.

BACKGROUND

Although applicable in principle to any measurement system, the present invention and its underlying problem will be hereinafter described in combination with a measurement by an oscilloscope.

In modern days electronic devices are used in a growing number of applications. Many electronical devices deal with signals of relative high frequencies. During development or production of electronic devices, it is necessary to thoroughly test these devices. For example, an oscilloscope may be used for measuring the signals and displaying a signal curve relating to the measured signal. Further, the oscilloscope may determine characteristic parameters of the measurement signal, in particular relating to the signal curve.

For computing the characteristic parameters of a digitally measured signal, the signal has to be measured and analyzed with high accuracy, i.e. a high sample rate and/or high resolution. Processing digital signals with such a high resolution and sample rate produces a huge amount of data and requires complex computational resources.

Against this background, a problem solved by the present invention is to provide a measurement system which can deal with both, computing characteristic parameters of a measurement signal with a high accuracy and processing, in particular displaying, the measured signal in real-time.

SUMMARY

The present invention therefore provides a measurement apparatus and a measurement method with the features of the independent claims. Further embodiments are subject of the dependent claims.

According to a first aspect, a measurement apparatus for digital data acquisition is provided. The measurement apparatus comprises a data acquisition device, a first memory, a decimator and a signal processor. The data acquisition device is adapted to receive a measurement signal and to provide a first digital data stream. The first digital data stream is generated by the data acquisition device based on the received measurement signal. In particular, the first digital data stream is sampled at a first sample rate. The first digital data stream may be sampled with a first accuracy. The first memory is adapted to store data of the first digital data stream. The decimator is adapted to receive the first digital data stream and to generate a second digital data stream based on the received first data stream. In particular, the second digital data stream is sampled at a second sample rate. The second digital data stream may be sampled with a second accuracy. The second sample rate is less than the first sample rate. The signal processor is adapted to perform a real-time processing of the second digital data stream in a first operation mode. The signal processor is further adapted to perform an off-line processing of the data of the first digital data stream, in particular the data stored in the first memory, in a second operation mode.

According to a second aspect, a measurement method for digital data acquisition is provided. The measurement method comprises a step of providing a first digital data stream based on a received measurement signal. The first digital data stream is sampled at a first sample rate. The first digital data stream may be sampled with a first accuracy. In particular, the providing of the first digital data stream may be performed by a data acquisition device. The method further comprises a step of storing data of the first digital data stream in a first memory. Further, the method comprises generating a second digital data stream based on the first digital data stream. The generation of the second digital data stream may be performed by a decimator. The second digital data stream is sampled at a second sample rate, wherein the second sample rate is less than the first sample rate. The second digital data stream may be sampled with a second accuracy, which may be less than the first accuracy. The method further comprises performing a real-time processing of the second digital data stream in a first operation mode and performing an off-line processing of the data of the first digital data stream in a second operation mode. The off-line processing of the data of the first digital data stream may be performed based on the digital data stored in the first memory. The processing of the first digital data stream and the second digital data stream may be performed by a signal processor.

The present invention is based on the fact that a precise computing of characteristics of a measurement signal may require digital data with a high accuracy, e.g. a high sample rate and high resolution. However, computational resources which can perform a processing of digital data with high resolution and high sample rate are complex and expensive. Furthermore, many real-time operations, for example processing the digital data for displaying a signal curve in real-time or scanning a signal for a predetermined event may be also performed with lower resolution and sample rate.

The present invention therefore takes into account this fact and aims to provide an apparatus and a method for measuring signals which can fulfill both, real-time analysis of a signal based on a lower accuracy and computing of characteristics of a signal in high accuracy. Therefore, the present invention aims to reduce the computational requirements for fulfilling both requirements.

Accordingly, a measurement signal may be acquired with a high accuracy, i.e. a high sample rate and/or a high resolution. The acquired high resolution data are stored in a memory for a later off-line analysis. Furthermore, the high resolution data are decimated, i.e. the sample rate and/or the resolution of the high resolution data stream is reduced. Accordingly, a second data stream having a reduced amount of data is provided. Such a data stream having a reduced amount of data may be processed in real-time by a simpler hardware. For example, the processing may analyze the second data stream with a reduced amount of data in order to identify a predetermined event, for example a trigger event or the like. Furthermore, the reduced amount of data may be processed for displaying a signal curve relating to the measurement signal. Accordingly, the signal curve may be provided on a display by means of a simple and cheap hardware for processing the respective data.

Upon request, it is possible to change in a further operation mode and to perform a high accuracy off-line analysis of the data stored in the first memory. Since this analysis of the high accuracy data has not to be performed in real-time, the computational requirements of the respective hardware are relative low, and thus a simple and cheap hardware may be used for this analysis. The analysis may be initiated, for example by identifying a predetermined trigger event in the second data stream having a reduced accuracy, or upon the operation mode of the measurement apparatus is changed, for example based on a user input or the like. However, it is understood that any other event for changing between the two operations modes may be also possible.

The data acquisition device may comprise an input terminal for receiving the measurement signal. For example, the measurement signal may be an analogue signal, and the received analog measurement signal may be digitized by the data acquisition device. For this purpose, the data acquisition device may comprise appropriate elements such as an analogue to digital converter, an attenuator, an amplifier, filter elements or the like. Furthermore, the devices of the measurement apparatus, in particular the data acquisition device, the memory, the decimator and the signal processor may be coupled with each other by a digital communication bus or the like.

The decimator may be realized by means of a hardware device. However, it may be also possible that the decimator is realized at least in part by software. For this purpose, instructions may be provided which may cause a processing unit to perform operations to cause the processing unit performing respective operations for decimating the first digital data stream.

The signal processor may be any kind of appropriate device for processing the respective signals. In particular, the signal processor may be adapted to receive the second digital data stream provided by the decimator and the data of the first digital data stream stored in the first memory. Furthermore, the signal processor may be connected to any appropriate device for outputting the results of the signal processor. For example, the signal processor may be coupled with a display for providing the respective results. For example, the display may be a display of an oscilloscope or the like. Furthermore, the signal processor may be also coupled with a further device to forward the results of the signal processor to the further device. The further device may be any appropriate device, for example a general purpose computer, a further measurement device, etc.

Further embodiments of the present invention are subject of the further subclaims and the following description referring to the drawings.

In a possible embodiment, the resolution of the first digital data stream is higher than a resolution of the second digital data stream.

Accordingly, the decimator may be configured to reduce the resolution of the first digital data stream when generating the second digital data stream. The resolution of a data stream indicates the number of discrete values which can be produced over a measurement range. Thus, the resolution determines the magnitude of a quantization error. In contrast to this, a sample rate determines the number of samples within a predetermined time period, e.g. a second. By reducing either the sample rate or the resolution or both, the sample rate and the resolution, the amount of data can be reduced. Consequently, by a reduced amount of data the computational requirements for processing the respective data are lower.

In a possible embodiment, the measurement apparatus further comprises a second memory. The second memory may be adapted to store the data of the second digital data stream.

By storing the data of the second data stream, i.e., the data stream having the reduced sample rate and/or resolution, the data of the second data stream may be also available for a further processing, e.g. a displaying of a signal curve or the like. For example, the data of the second data stream stored in the second memory may be used for buffering the second data stream or the like.

In a possible embodiment, the data acquisition device may comprise an analogue to digital converter. The analogue to digital converter may be adapted to receive an analogue measurement signal and to digitize the received analogue measurement signal at a predetermined sample rate and/or resolution. The predetermined sample rate may be equal or higher than the first sample rate.

In this way, the analogue measurement signal may be converted to a digital signal which is appropriate for the further processing by the measurement apparatus. By providing the digitized measurement signal at a sample rate higher or equal than the required first sample rate, the digital data are provided with an appropriate accuracy.

In a possible embodiment, the data acquisition device may comprise a further decimator. The further decimator may be adapted to reduce the sample rate of the digitized measurement signal provided by the analogue to digital converter to the first sample rate.

Accordingly, the first digital data stream can be provided with a desired sample rate, even if the measurement signal is sampled with a higher sample rate. In this way, well-defined conditions for performing the signal processing can be achieved.

In a possible embodiment, the measurement apparatus comprises a display. The display may be adapted to continuously display the processed second data stream in the first operation mode. The display may be further adapted to display a result of the processed first digital data stream in the second operation mode.

For example, the display may be a display of an oscilloscope or the like. Accordingly, a continuous representation of the signal curve of the measurement signal may be provided based on the second digital data stream. Furthermore, additional information relating to the measurement signal may be computed and provided with a high accuracy. Hence, it is possible to achieve a continuous displaying of a measurement signal in addition to a computation of additional information with a high accuracy based on a relative simple and cheap hardware.

In a possible embodiment, the first operation mode is a roll mode or a scan mode of an oscilloscope. Furthermore, a second operation mode may be a stop mode or a holding mode of the oscilloscope.

Accordingly, in a roll mode or scan mode it is possible to continuously provide a representation corresponding to the measurement signal on a display of the oscilloscope. This representation can be provided with a relative low accuracy. Furthermore, when changing to a stop or holding mode, the high accuracy data of the first digital data stream may be used in order to improve the accuracy and the precision of the provided data.

In a possible embodiment, the signal processor is adapted to compute at least one characteristic parameter of the signal based on the first digital data stream.

The at least one characteristic parameter of the signal may comprise a waveform characteristic or the like. For example, the characteristic parameter may comprise a frequency analysis, an analysis of the magnitude of the measurement signal, a determination of a periodic length, determination of a rising or falling time, computation of average values over a predetermined time period, or any other further parameter referring to a characteristic of the measurement signal.

In a possible embodiment, the measurement apparatus comprises a switch. The switch may comprise a first input port adapted to receive the first digital data stream, a second input port adapted to receive the second digital data stream and an output port connected to the signal processor. The switch may be adapted to forward either the first digital data stream or the second digital data stream to the signal processor.

The switch may be triggered, for example by a provided digital signal or a user input. Accordingly, by switching between the first and the second digital data stream, the data provided to the signal processor can be selected.

In a possible embodiment, the signal processor may comprise a first processing means and a second processing means. The first processing means may be adapted to process the first digital data stream. The second processing means may be adapted to process the second digital data stream. Accordingly, separate processing means for processing the first data stream and the second data stream may be used. In this way, the operation of the individual processing means can be adapted to the respective settings of the related data streams.

With the present invention it is therefore now possible to perform a real-time processing of a measurement signal and additionally perform a further processing with a high accuracy, wherein only a relative simple and cheap hardware is required for both operations. This is achieved by performing the real-time operation with a lower sample rate and/or resolution, and perform a high accuracy computation off-line based on previously stored digital data having a higher sample rate and/or resolution.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
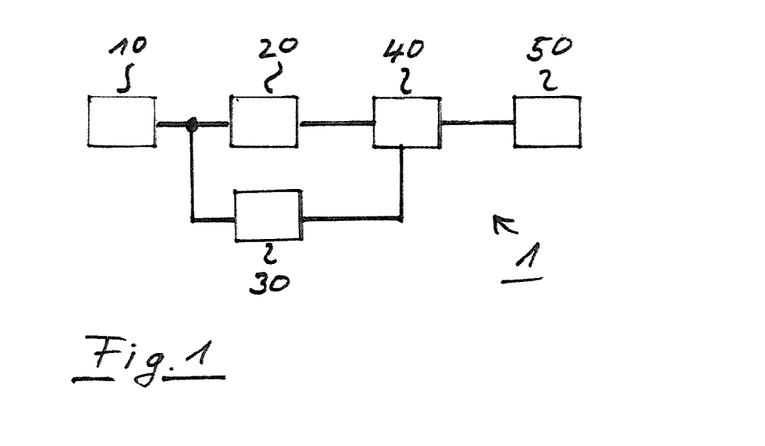
FIG. 1 shows a block diagram of an embodiment of a measurement apparatus according to the present invention.

FIG. 1 shows a schematic drawing of a measurement apparatus 1. The measurement apparatus 1 may comprise a data acquisition device 10, a first acquisition memory 20, a decimator 30 and a signal processor 40. The data acquisition device 10 may receive a measurement signal and provide a first digital data stream based on the received measurement signal. The first digital data stream may be a data stream having a predetermined first sample rate and a predetermined first resolution. For example, data acquisition device 10 may receive an analogue measurement signal, and data acquisition device 10 may digitize the received analogue measurement signal according to the predetermined settings, e.g. according to the predetermined first sample rate and/or the first resolution.

Data acquisition device 10 may continuously output the first data stream based on the received measurement signal. Alternatively, it may be also possible that data acquisition device 10 may receive a digital measurement signal and convert the received digital measurement signal according to predetermined settings such as the first sample rate and/or the first resolution. In this case, the sample rate and the resolution of the received digital measurement signal should be equal or at least the same as the desired first sample rate/resolution. The received measurement signal may be any kind of measurement signal. For example, the received measurement signal may be an electrical signal. In particular, the measurement signal may be an electrical signal for measuring a voltage. However, it is understood that any other kind of measurement signal which could be converted to digital data may be also used.

Data acquisition device 10 may be coupled with the first acquisition memory 20, and the data of the first digital data stream from the data acquisition device 10 may be stored in the first data acquisition memory 20. The first acquisition memory 20 may be any kind of digital memory such as a volatile or non-volatile memory. For example, the data of the first digital data stream may be stored in the first acquisition memory 20 in a cyclic manner. In this case, the first acquisition memory 20 may store the data of the first digital data stream relating to a predetermined time period or a predetermined amount of data. Upon data relating to the predetermined time period or the predetermined amount of data have been stored in the first acquisition memory 20, the oldest data will be overwritten by newly received data. In this way, it is possible to maintain data of the first digital data stream which refer to a predetermined time period in the past. However, it is understood that any other scheme for storing the data of the first digital data stream in the first data acquisition memory 20 may be also possible.

Additionally, the output of the data acquisition device 10 may be provided to decimator 30. For example, a same first data stream may be provided simultaneously to the first acquisition memory 20 and the decimator 30. Alternatively, it may be also possible that data acquisition device 10 may provide a further data stream which corresponds to the first digital data stream and the further data stream is provided to decimator 30. In the latter case, independent communication links between the data acquisition device 10 and the first memory 20, and between the acquisition device 10 and the decimator 30 may be used.

Decimator 30 may receive the output of the data acquisition device 10 and generate a second data stream based on the received first digital data stream. The second digital data stream may have a second sample rate and a second resolution, wherein the second sample rate and/or the second resolution is lower than the sample rate and the resolution of the first digital data stream. For example, the sample rate and/or the resolution of the second digital data stream may be reduced by a factor of 2, 5, 10, 20, 50, 100 or even more.

The second digital data stream generated by decimator 30 may be provided to signal processor 40. For this purpose, signal processor 40 may be communicatively coupled with decimator 30. Further, signal processor 40 may be also communicatively coupled with the first acquisition memory 20.

As already mentioned above, signal processor 40 may receive the second digital data stream generated by decimator 30. In a first operation mode, signal processor 40 may perform a predetermined processing of the data of the second digital data stream. In particular, the processing of the second digital data stream may be performed in real-time. In this operation mode, the data of the second digital data stream are processed by signal processor 40 upon receiving the respective data of the second digital data stream. For example, signal processor 40 may process the data of the second digital data stream for displaying a representation on a display 50. For example, a signal curve according to the data of the second digital data stream may be displayed on a display 50. For example, the display 50 may be a display of an oscilloscope or another measurement device. The signal curve may be displayed, for example in a roll mode or a scan mode of the oscilloscope. In this way, the signal curve according to the measurement signal received by acquisition device 10 can be provided on the display 50 in real-time. Since the processing for displaying the signal curve is performed based on the second digital data stream which has a reduced amount of data, the processing of the data requires low computational resources.

Additionally or alternatively, it may be also possible that signal processing device 40 may analyze the data of the second digital data stream in order to identify a predetermined property. For example, a rising or falling edge having a predetermined characteristic may be identified. However, it may be also possible to identify any other kind of predetermined characteristic, for example a comparison with a predetermined threshold, identifying a predetermined frequency, maintaining a predetermined level for a predetermined period of time, etc. Upon identifying such a predetermined characteristic in the signal based on an analysis of the second digital data stream by the signal processor 40, a predetermined operation may be initiated. For example, the measurement apparatus 1, in particular signal processor 40 may change in a second operation mode. However, it may be also possible that the measurement apparatus 1, in particular the signal processor 40 may change to the second operation mode upon an external signaling or a user input.

The second operation mode may be, for example a stop mode or a hold mode of an oscilloscope. In the second operation mode, the signal processor 40 may readout the data stored in the first acquisition memory 20 which correspond to the data of the first digital data stream. Accordingly, signal processor 40 may perform a processing of the stored data of the first digital data stream. Thus, a processing is performed based on the data having a higher sample rate and/or a higher resolution. For example, the resolution and/or the sample rate of a signal curve displayed on display 50, may be improved by using the stored data of the first digital data stream.

In the second operation mode, the processing of the data, in particular of the data stored in the first acquisition memory 20 is performed off-line. In other words, the processing is performed based on a constant data basis which does not change over the time. Accordingly, the representation on display 50, for example a signal curve displayed on a display 50 is kept constant in the second operation mode. In contrast to this, the representation on a display 50 may continuously change over the time in the first operation mode, whereby the representation on display 50 is continuously adapted based on the newly received data of the second digital data stream.

Signal processor 40 may also perform a detailed analysis of the data stored in the first acquisition memory 20 in the second operation mode. For example, signal processor 40 may compute a characteristic parameter of the measurement signal based on the data stored in the first acquisition memory 20. In particular, signal processor 40 may compute any kind of characteristics of a waveform of the measurement signal. For example, signal processor 40 may compute one or more frequencies included in the measurement signal. In particular, signal processor 40 may compute a spectrum of the measurement signal based on the data stored in the first acquisition memory 20. However, it is understood that any other kind of characteristic parameter of the measurement signal may be computed. For example, signal processor 40 may compute a maximum and/or minimum value, a periodic time, a position of a rising or falling edge, identify an overshoot, or perform any other kind of computation based on the data of the first digital data stream stored in the first acquisition memory 20. The result of the computation by signal processor 40 may be provided on the display 50. Additionally or alternatively, the result of signal processor 40 may be also provided to a further device, for example a further measurement device or further processing device such as a general purpose processor or the like. Furthermore, the result of signal processor 40 may be also output on a printer or plotter.

Figure 2:
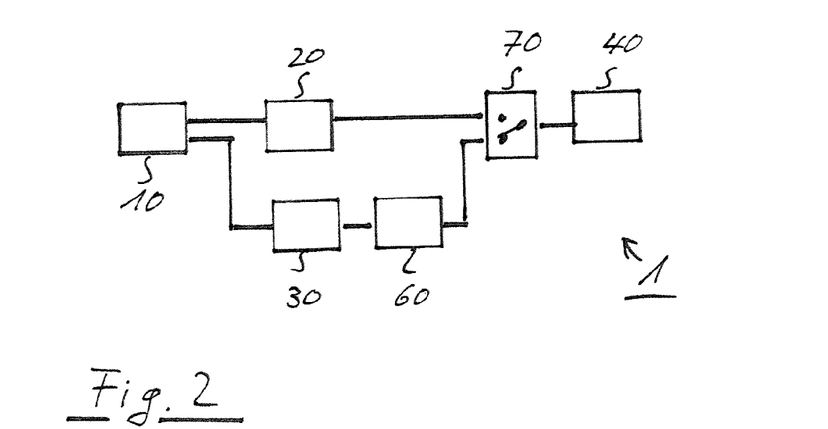
FIG. 2 shows a block diagram of a further embodiment of a measurement apparatus according to the present invention.

FIG. 2 shows a further embodiment of a measurement apparatus 1 according to the present invention. The elements in FIG. 1 and the following figures mainly correspond to the elements already described in connection with FIG. 1. Thus, the explanation of FIG. 1 also applies to the following figures. Furthermore, it is understood that the embodiments described herein may be combined in any appropriate manner.

As can be seen in FIG. 2, data acquisition device 10 may comprise an analogue to digital converter 11. The analogue to digital converter 11 may receive an analogue measurement signal and digitize the received analogue signal. In particular, analogue to digital converter 11 may output digital data stream having a fixed sample rate and/or resolution. However, it may be also possible that analogue to digital converter 11 may output the digitized signal having a variable sample rate and/or resolution. In any case, the sample rate and/or resolution of the digitized signal provided by analogue to digital converter 11 should be higher or at least the same as the desired sample rate and/or resolution of the first digital data stream.

In case the sample rate and/or resolution of the digitized measurement signal is higher than the desired sample rate/resolution of the first digital data stream, the digitized signal from analogue to digital converter 11 may be provided to a further decimator 12. The further decimator 12 may receive the digitized measurement signal and output a first digital data stream having a desired predetermined sample rate and a predetermined desired resolution. The first digital data stream may be provided to the first acquisition memory 20 for storing the data of the first digital data stream. Additionally, the first digital data stream is provided to decimator 30 as described above. The data of the first digital data stream may be provided to the first memory 20 and the decimator 30 by separate communication links. However, it may be also possible that a common communication link may be used for providing the data of the first digital data stream to the first acquisition memory 20 and the decimator 30. Furthermore, it may be also possible that the input of decimator 30 is directly connected with the output of analogue to digital converter 11. In this case, the digitized measurement signal provided by analogue to digital converter 11 may be directly used for generating the second digital data stream having the desired sample rate and/or resolution.

As can be further seen in FIG. 2, the output of decimator 30 may be connected with a second acquisition memory 60. For example, the output of decimator 30 may be buffered by the second acquisition memory 60. For example, the second acquisition memory 60 may be a first in first out memory, i.e. a memory providing the data at an output port in a same order as the data are received at an input port. Second memory 60 may be also a cyclic memory as already described above in connection with the first acquisition memory 20.

Furthermore, the measurement apparatus 1 may comprise a switch 70. A first input port of switch 70 may be connected with the output of the first acquisition memory 20. A second input port of switch 70 may be connected with the output of the second acquisition memory 60. Additionally or alternatively, the second input port of switch 70 may be connected with the output of the decimator 30. An output port of switch 70 may be connected with the input of signal processor 40. Accordingly, switch 70 may change the source for providing data to signal processor 40. In particular, the source may be changed depending on the operation mode of measurement apparatus 1. In a first operation mode, signal processor 40 may be provided with data of the second digital data stream, i.e. the output of decimator 30 and/or the data stored in the second acquisition memory 60. In the second operation mode, signal processor 40 may be provided with data of the first digital data stream, i.e. the data stored in the first acquisition memory 20.

Figure 3:
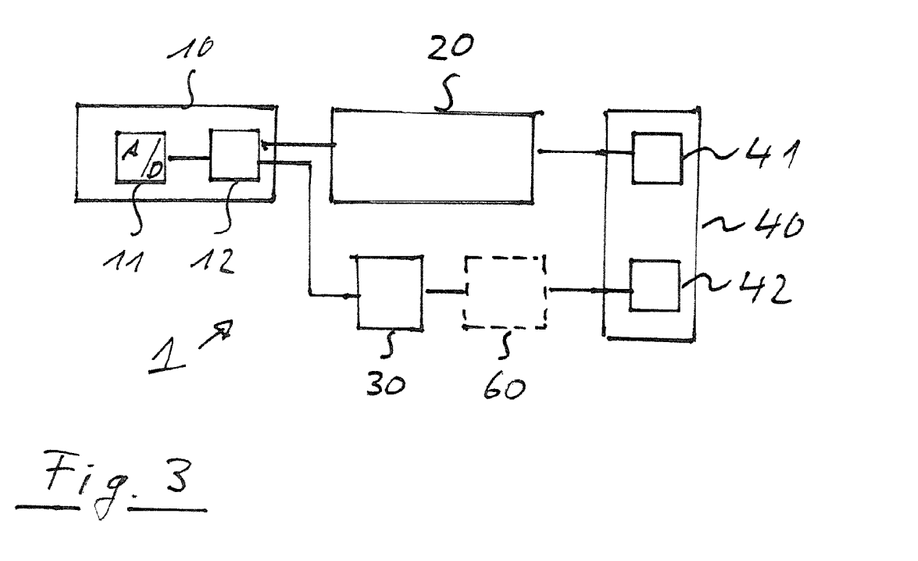
FIG. 3 shows a block diagram of another embodiment of a measurement apparatus according to the present invention.

FIG. 3 shows a further embodiment of measurement apparatus 1. The measurement apparatus 1 according to FIG. 3 mainly corresponds to the previously described measurement apparatuses 1. As can be seen in FIG. 3, signal processor 40 may comprise a first processing means 41 and a second processing means 42. The first processing means 41 may be coupled with the first acquisition memory 20. The first processing means 41 may be adapted to process the data of the first digital data stream. The second processing means 42 may be coupled with decimator 30. Additionally or alternatively, second processing means 42 may be coupled with the second acquisition memory 60 as described above in connection with FIG. 2. The second processing means 42 may perform a processing of data of the second digital data stream. In this way, real-time processing based on the data of the second digital data stream, and off-line processing of the data of the first digital data stream may be performed by separate processing means 41, 42. In particular, the processing according to the second digital data stream and the first digital data stream may be performed even simultaneously. For example, it may be possible to generate a graphical representation of the measurement signal based on the data of the second digital data stream by the second processing means 42 in real-time. Additionally, the first processing means 41 may readout the data stored in the first acquisition memory 20 and perform a processing of these data. For example, the processing by the first processing means 41 may be performed at predetermined time intervals. In other words, data for a predetermined time interval may be stored in the first acquisition memory 20, and the first processing means 41 may perform only a single analysis of the set of data for the predetermined time period. For example, data relating to a time period of a second, a millisecond or another predetermined time period may be considered together, and the first signal processing means 41 may perform a single analysis for all data referring to such a time interval.

Figure 4:
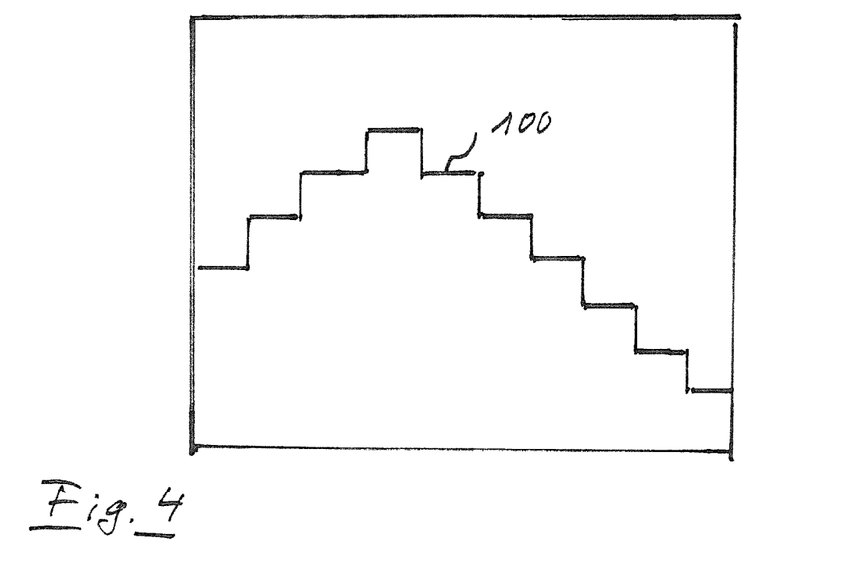
FIG. 4 shows a diagram of a signal curve display in first operation mode of a measurement apparatus according to an embodiment of the present invention.

FIG. 4 shows a graphical representation of a signal curve 100 in a first operation mode. In the first operation mode, signal processor 40 performs the processing based on the second digital data stream having a reduced sample rate and/or resolution. Thus, the signal curve 100 may be also provided only with such a reduced sample rate or resolution.

Figure 5:
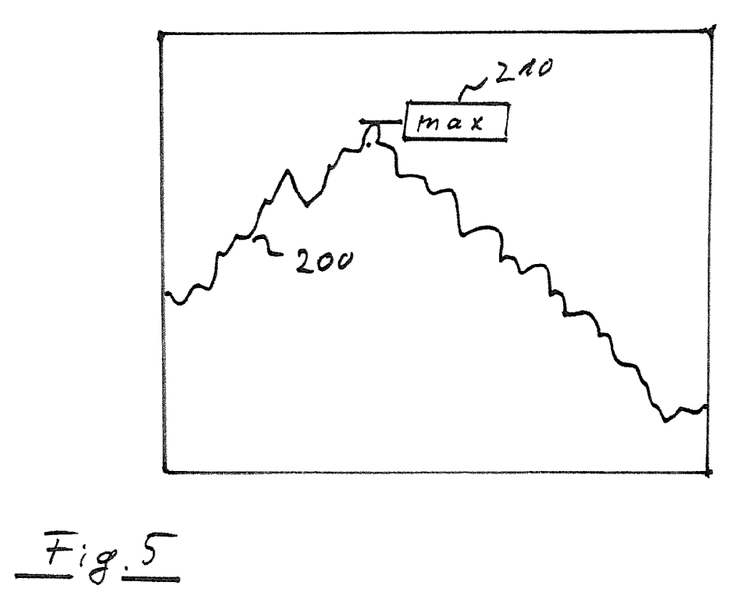
FIG. 5 shows a diagram of a signal curve display in second operation mode of a measurement apparatus according to an embodiment of the present invention.

FIG. 5 shows a graphical representation according to the second operation mode. In the second operation mode, signal processor 40 may perform a processing based on the first digital data stream having a higher sample rate and/or resolution. Accordingly, the signal curve 200 may be provided with a higher accuracy. Furthermore, it may be possible to compute one or more characteristic parameters and to further provide these characteristic parameters. For example, a maximum value 210 may be indicated in the result of signal processor 40 in the second operation mode.

For sake of clarity in the following description of the method based FIG. 6 the reference signs used above in the description of apparatus based FIGS. 1-5 will be maintained.

Figure 6:
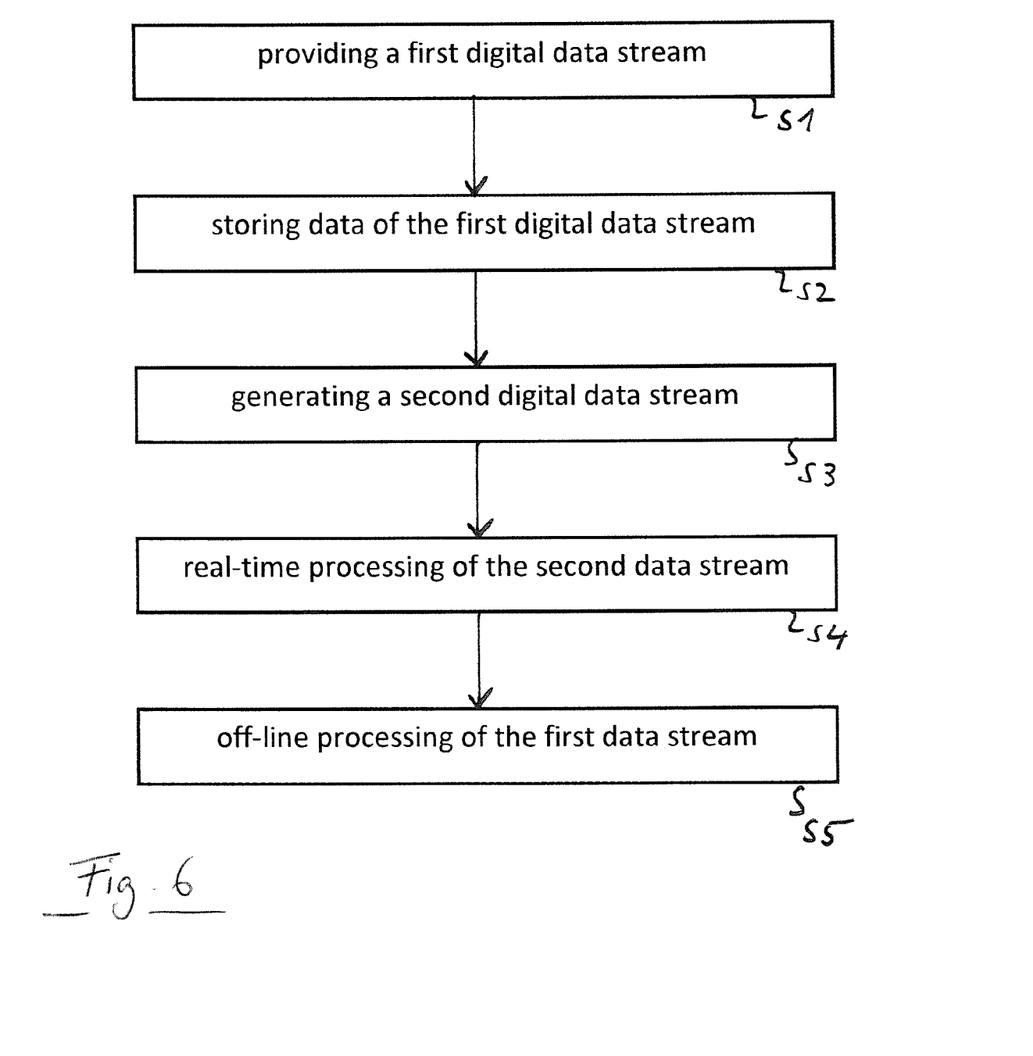
FIG. 6 shows a flow diagram of an embodiment of a measurement method according to the present invention.

FIG. 6 shows a flow chart of measurement method according to an embodiment of the present invention. The method comprises a step S1 of providing a first digital data stream based on a received measurement signal. The first digital data stream may be sampled at a first sample rate. The first digital data stream may be provided by a data acquisition device 10. The method further comprises a step S2 of storing data of the first digital data stream in a first memory 20. Further, the method comprises a step S3 of generating a second digital data stream based on the first digital data stream. The second digital data stream may be sampled at a second sample rate. The second sample rate is less than the first sample rate. The generation of the second digital data stream may be performed by a decimator 30. The method further comprises a step S4 of performing a real-time processing of the second digital data stream in a first operation mode; and a step S5 of performing an off-line processing of the data of the first digital data stream stored in the first memory 20 in a second operation mode. The processing steps S4 and S5 may be performed by a signal processor 40.

A resolution of the first digital data stream may by higher than a resolution of the second digital data stream.

The method may further comprise storing the data of the second digital data stream a second memory 60.

The method may further comprise receiving an analogue measurement signal and digitizing the received analogue measurement signal at a predetermined sampling rate by an analogue to digital converter. The predetermined sampling rate may be equal or higher than the first sampling rate.

The method may further comprise reducing the sampling rate of the digitized measurement signal to the first sampling rate. The reducing of the sample rate may be performed by a further decimator 12.

The method may further comprise continuously displaying the processed second digital data stream on a display 50 in the first operation mode, and displaying a result of the processed first digital data stream on the display 50 in the second operation mode.

The first operation mode may be a roll mode or a scan mode of an oscilloscope. The second operation mode may be a stop mode or a hold mode of the oscilloscope.

The method may further comprise computing at least one characteristic parameter of the signal based on the first digital data stream.

The method may further comprise forwarding either the first digital data stream or the second digital data stream to the signal processor 40. The forwarding may be performed by a switch 70.

The method may further comprise processing the first digital data stream by a first processing means 41, and processing the second digital data stream by a second processing means 42.

Summarizing, the present invention relates to a measurement for digital data acquisition. A first operation mode is provided for real-time processing of digital data having a reduced sample rate or resolution. Furthermore, a second operation mode is provided for processing the measurement signal off-line with a higher accuracy. In particular, the high accuracy data may be temporarily stored and analyzed upon the operation mode is changed from the real-time mode to the off-line mode.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measurement apparatus for digital data acquisition, the apparatus comprising an oscilloscope,
wherein the oscilloscope comprises:
a data acquisition device adapted to receive a measurement signal and to provide a first digital data stream, wherein the first digital data stream is generated based on the received measurement signal sampled at a first sample rate;
a first memory adapted to store data of the first digital data stream;
a decimator adapted to receive the first digital data stream and to generate a second digital data stream sampled at a second sample rate based on the received first digital data stream; and
a signal processor adapted to perform a real-time processing of the second digital data stream in a first operation mode of the oscilloscope, and to perform an off-line processing of the data of the first digital data stream stored in the first memory in a second operation mode of the oscilloscope,
a display adapted to continuously display the processed second digital data stream in the first operation mode, and to display a result of the processed first digital data stream in the second operation mode;
wherein the real-time processing of the second digital data stream comprises at least one of processing the second digital data stream for displaying a signal curve in real-time or scanning the second digital data stream for identifying a pre-determined event.

2. The measurement apparatus according to claim 1, wherein a resolution of the first digital data stream is higher than a resolution of the second digital data stream.

3. The measurement apparatus according to claim 1, comprising a second memory adapted to store the data of the second digital data stream.

4. The measurement apparatus according to claim 1, wherein the data acquisition device comprises an analogue to digital converter adapted to receive an analogue measurement signal and to digitize the received analogue measurement signal at a predetermined sample rate, the predetermined sample rate being equal or higher than the first sample rate.

5. The measurement apparatus according to claim 4, wherein the data acquisition device comprises a further decimator adapted to adapt the sample rate of the digitized measurement signal to the first sample rate.

6. The measurement apparatus according to claim 1, wherein the first operation mode is a rolling mode or a scan mode of the oscilloscope, and wherein the second operation mode is a stop mode or a holding mode of the oscilloscope.

7. The measurement apparatus according to claim 1, wherein the signal processor is adapted to compute at least one characteristic parameter of the signal based on the first digital data stream.

8. The measurement apparatus according to claim 1, comprising a switch comprising a first input port adapted to receive the first digital data stream, a second input port adapted to receive the second digital data stream and an output port connected to the signal processor, wherein the switch is adapted to forward either the first digital data stream or the second digital data stream to the signal processor.

9. The measurement apparatus according to claim 1, wherein the signal processor comprises a first processing means coupled to the first memory and adapted to process the first digital data stream, and the signal processor comprises a second processing means coupled with the decimator and adapted to process the second digital data stream.

10. A measurement method for digital data acquisition by an oscilloscope, the method comprising:
providing, by a data acquisition device of the oscilloscope, a first digital data stream based on a received measurement signal, wherein the first digital data stream is sampled at a first sample rate;
storing data of the first digital data stream in a first memory of the oscilloscope;
generating, by a decimator of the oscilloscope, a second digital data stream based on the first digital data stream, wherein the second digital data stream is sampled at a second sample, the second sample rate being less than the first sample rate;
performing a real-time processing of the second digital data stream by a signal processor in a first operation mode of the oscilloscope;
performing an off-line processing of the data of the first digital data stream stored in the first memory by the signal processor in a second operation mode of the oscilloscope, and
continuously displaying the processed second digital data stream on a display in the first operation mode, and displaying a result of the processed first digital data stream on the display in the second operation mode,
wherein the real-time processing of the second digital data stream comprises at least one of processing the second digital data stream for displaying a signal curve in real-time or scanning the second digital data stream for identifying a pre-determined event.

11. The measurement method according to claim 10, wherein a resolution of the first digital data stream is higher than a resolution of the second digital data stream.

12. The measurement apparatus according to claim 10, comprising storing the data of the second digital data stream a second memory.

13. The measurement method according to claim 10, comprising receiving an analogue measurement signal and digitizing the received analogue measurement signal at a predetermined sampling rate by an analogue to digital converter, wherein the predetermined sampling rate is equal or higher than the first sampling rate.

14. The measurement method according to claim 13, comprising reducing the sampling rate of the digitized measurement signal to the first sampling rate by a further decimator.

15. The measurement method according to claim 10, wherein the first operation mode is a rolling mode or a scan mode of the oscilloscope, and wherein the second operation mode is a stop mode or a holding mode of the oscilloscope.

16. The measurement method according to claim 10, comprising computing at least one characteristic parameter of the signal based on the first digital data stream.

17. The measurement method according to claim 10, comprising forwarding either the first digital data stream or the second digital data stream to the signal processor by a switch.

18. The measurement method according to claim 10, comprising processing the first digital data stream by a first processing means which is coupled with the first memory, and processing the second digital data stream by a second processing means which is coupled with the decimator.

\* \* \* \* \*